United States Patent
Wan et al.

(10) Patent No.: US 11,753,497 B2
(45) Date of Patent: Sep. 12, 2023

(54) PHOTOCURABLE COMPOSITION

(71) Applicant: CANON KABUSHIKI KAISHA, Tokyo (JP)

(72) Inventors: Fen Wan, Austin, TX (US); Weijun Liu, Cedar Park, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 204 days.

(21) Appl. No.: 17/244,508

(22) Filed: Apr. 29, 2021

(65) Prior Publication Data

US 2022/0363807 A1 Nov. 17, 2022

(51) Int. Cl.
| | |
|---|---|
| *C08F 2/46* | (2006.01) |
| *C08G 61/04* | (2006.01) |
| *C08G 18/71* | (2006.01) |
| *C08G 18/67* | (2006.01) |
| *G03F 7/20* | (2006.01) |
| *G03F 7/028* | (2006.01) |
| *C08K 5/5397* | (2006.01) |

(52) U.S. Cl.
CPC .......... *C08G 18/711* (2013.01); *C08G 18/673* (2013.01); *C08K 5/5397* (2013.01); *G03F 7/028* (2013.01); *G03F 7/2012* (2013.01)

(58) Field of Classification Search
CPC ......................... C08G 18/8108; C08G 18/714; C08G 18/711; C08G 18/8116; C08G 18/712; C08G 18/673; G03F 7/2012; G03F 7/028; C08K 5/5397
USPC ............................................. 522/5, 1; 520/1
See application file for complete search history.

(56) References Cited

U.S. PATENT DOCUMENTS

| | | | | |
|---|---|---|---|---|
| 7,745,505 B2 * | 6/2010 | Liu | ........................ | C07F 7/0838 |
| | | | | 526/329.2 |
| 8,106,134 B2 | 1/2012 | Egashira | | |
| 9,275,560 B2 | 3/2016 | Zhang | | |
| 9,617,454 B2 | 4/2017 | Gaillard | | |
| 10,457,597 B2 | 10/2019 | Wang | | |
| 2003/0118941 A1 * | 6/2003 | Hayakawa | .......... | C08F 222/102 |
| | | | | 430/281.1 |
| 2007/0021520 A1 | 1/2007 | Xu | | |
| 2012/0016050 A1 | 1/2012 | Leon | | |
| 2020/0339828 A1 | 10/2020 | Li | | |

FOREIGN PATENT DOCUMENTS

| | | | |
|---|---|---|---|
| CN | 108003802 | * | 3/2021 |
| KR | 20110007687 A1 | | 1/2011 |
| KR | 1020110007687 | * | 1/2011 |
| WO | 2010053558 A1 | | 5/2010 |
| WO | WO-2016153036 A1 * | 9/2016 | .............. C09J 11/06 |

OTHER PUBLICATIONS

Lee et al, KR 1020110007687 Machine Translation, Jan. 25, 2011 (Year: 2011).*
Mitsushima, WO 2016-153036 Machine Translation, Sep. 29, 2016 (Year: 2016).*
Wang et al, CN 108003802 Machine Translation, Mar. 30, 2021 (Year: 2021).*

* cited by examiner

Primary Examiner — Jessica Whiteley
(74) Attorney, Agent, or Firm — Abel Schillinger, LLP

(57) ABSTRACT

In one embodiment, a photocurable composition can comprise a polymerizable material and a photoinitiator, wherein the polymerizable material includes an isocyanate group containing compound of formula (1): R1-R2-N=C=O (1), with R1 including a carbon-carbon double bond, and R2 being substituted or unsubstituted alkyl, aryl, or alkylaryl. An amount of 1 wt % to 10 wt % of the isocyanate group containing compound can cause a strong adhesion strength of the photocurable composition to a silicon substrate after curing, and may allow the omission of an adhesion layer between substrate and the photo-cured layer.

19 Claims, 1 Drawing Sheet

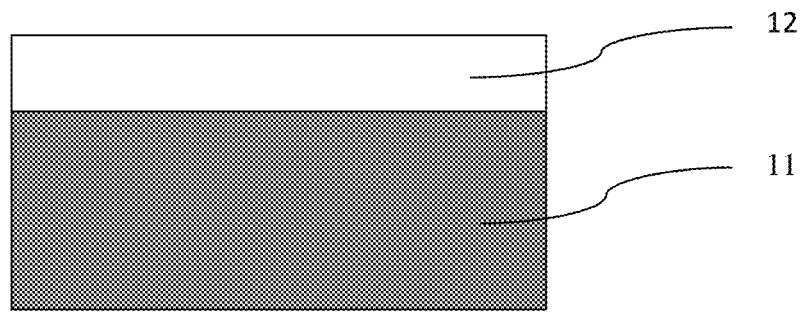

PHOTOCURABLE COMPOSITION

FIELD OF THE DISCLOSURE

The present disclosure relates to a photocurable composition adapted for use in nanoimprint lithography (NIL) or inkjet adaptive planarization (IAP) processing. The photocurable composition comprises a polymerizable material including an isocyanate group containing compound.

BACKGROUND

Inkjet Adaptive Planarization (IAP) uses a flowable liquid (resist) to fill trenches, gaps, or other topography variations on a substrate. The applied liquid resist is then contacted by and cured under a superstrate to form a planar layer. In Nanoimprint Lithography (NIL), a template is filled with a liquid resist and after curing and further processing, the pattern of the template is transferred to the underlying substrate. During IAP and NIL processing typically an adhesion layer is applied between the substrate and the resist to enhance the adhesion of the resist to the substrate.

There exists a need to develop photocurable compositions which can be directly applied on the substrate and have a strong adhesion to the substrate, such that an adhesion layer between substrate and resist is not required. Omitting an adhesion layer between substrate and resist could reduce processing time and costs and may further enhance the product quality.

SUMMARY

In one embodiment, a photocurable composition can comprise a polymerizable material and a photoinitiator, wherein the polymerizable material may comprise at least one first monomer and at least one second monomer, the at least one first monomer including an isocyanate group containing compound of formula (1): $R_1$-$R_2$—N=C=O (1), with $R_1$ including a carbon-carbon double bond, and $R_2$ being substituted or unsubstituted alkyl, aryl, or alkylaryl; and an amount of the isocyanate group containing compound can be between 1 wt % to 10 wt % based on the total weight of the photocurable composition.

In one aspect of the photocurable composition, $R_1$ of formula (1) can be selected from an acrylate group, a methacrylate group or a vinyl group.

In another aspect, $R_2$ of formula (1) can be phenyl, or $C_1$-$C_{10}$ alkyl, or ($C_1$-$C_6$-alkyl) phenyl.

In certain aspects of the photocurable composition, the isocyanate group containing compound of formula (1) can be selected from 2-isocyanatoethyl acrylate, 3-isopropenyl-α,α-dimethylbenzyl isocyanate, 2-isocyanatoethyl methacrylate, allyl isocyanate, or any combination thereof.

In a particular certain aspect, the isocyanate group containing compound can be selected from 2-isocyanatoethyl acrylate or 3-isopropenyl-α,α-dimethylbenzyl isocyanate.

In a further aspect of the photocurable composition, the amount of the polymerizable material can be at least 90 wt % based on a total weight of the photocurable composition.

In another aspect of the photocurable composition, the at least one second monomer of the polymerizable material can include an acrylate monomer, a maleimide monomer, an epoxide monomer, or a vinylbenzene.

In yet a further aspect, the at least one second monomer of the photocurable composition can include at least one mono-functional acrylate monomer and at least one multi-functional acrylate monomer. In a particular aspect, the amount of the multi-functional acrylate monomer can be at least 20 wt % based on the total weight of the photocurable composition. In a certain particular aspect, the amount of the multi-functional acrylate monomer may be at least 40 wt % based on the total weight of the photocurable composition.

In another aspect, a viscosity of the photocurable composition at 23° C. can be not greater than 30 mPa·s. In a certain particular aspect, the viscosity of the curable composition at 23° C. may be not greater than 15 mPa·s.

In yet a further aspect, the photocurable composition can be essentially free of a solvent.

In one embodiment, a laminate can comprise a substrate and a photo-cured layer directly overlying the substrate, wherein the photo-cured layer may be formed from the photocurable composition of claim 1.

In one aspect of the laminate, an adhesion strength of the photo-cured layer according to ASTM D 4541 can be at least 6.5 MPa.

In another embodiment, a method of forming a photo-cured layer on a substrate can comprise: applying a layer of a photocurable composition directly on the substrate, wherein the photocurable composition comprises a polymerizable material and a photoinitiator, the polymerizable material comprising at least one first monomer and at least one second monomer, the at least one first monomer including 1 wt % to 10 wt % of an isocyanate group containing compound of formula (1): $R_1$-$R_2$—N=C=O (1), with $R_1$ including a carbon-carbon double bond, and $R_2$ being substituted or unsubstituted alkyl, aryl, or alkylaryl; bringing the photocurable composition into contact with an imprint template or a superstrate; irradiating the photocurable composition with light to form a photo-cured layer; and removing the imprint template or superstrate from the photo-cured layer.

In one aspect of the method, the isocyanate group containing compound of formula (1) can be selected from 2-isocyanatoethyl acrylate, 3-isopropenyl-α,α-dimethylbenzyl isocyanate, 2-isocyanatoethyl methacrylate, allyl isocyanate, or any combination thereof.

In another aspect of the method, the at least one second monomer of the polymerizable material can include at least one mono-functional acrylate monomer and at least one multi-functional acrylate monomer.

In a further aspect of the method, the amount of the polymerizable material can be at least 90 wt % based on a total weight of the curable composition.

In another embodiment, a method of manufacturing an article can comprise: applying a layer of a photocurable composition on a substrate, wherein the photocurable composition comprises a polymerizable material and a photoinitiator, the polymerizable material comprising at least one first monomer and at least one second monomer, the at least one first monomer including 1 wt % to 10 wt % of an isocyanate group containing compound of formula (1): $R_1$-$R_2$—N=C=O (1), with $R_1$ including a carbon-carbon double bond, and $R_2$ being substituted or unsubstituted alkyl, or aryl, or alkylaryl; bringing the photocurable composition into contact with an imprint template or a superstrate; irradiating the photocurable composition with light to form an at least partially photo-cured layer; removing the imprint template or the superstrate from the at least partially photo-cured layer; forming a pattern on the substrate; processing the substrate on which the pattern has been formed in the forming; and manufacturing an article from the substrate processed in the processing.

BRIEF DESCRIPTION OF THE DRAWINGS

Embodiments are illustrated by way of example and are not limited in the accompanying FIGURES.

FIG. 1 includes a line drawing illustrating a laminate according to one embodiment.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a photocurable composition comprising a polymerizable material and a photo-initiator, wherein the polymerizable material can comprise at least one first monomer and at least one second monomer, the at least one first monomer including an isocyanate group containing compound of formula (1): $R_1$-$R_2$—N=C=O (1), with $R_1$ including a carbon-carbon double bond, and $R_2$ being substituted or unsubstituted alkyl, aryl, or alkylaryl. The amount of the isocyanate group containing compound can be between 1 wt % and 10 wt % based on the total weight of the photocurable composition.

In one aspect, $R_1$ of formula (1) can be selected from an acrylate group, a methacrylate group, or a vinyl group. In a further aspect, $R_2$ of formula (1) can be phenyl, or $C_1$-$C_{10}$ alkyl, or ($C_1$-$C_6$ alkyl)-phenyl. As used herein, the term "alkyl" can include a straight or branched alkyl structure.

In a further aspect, the isocyanate group containing compound of formula (1) can be a small molecule having a molecular weight not greater than 1000 g/mol, such as not greater than 500 g/mol, not greater than 400 g/mol, not greater than 300 g/mol, or not greater than 200 g/mol.

In certain aspects, the isocyanate group containing compound of formula (1) can be selected from:

i) 2-isocyanatoethyl acrylate (ICA)

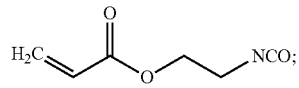

ii) 3-isopropenyl-α,α-dimethylbenzyl isocyanate (IDI)

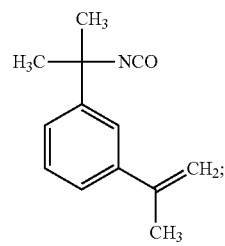

iii) 2-isocyanatoethyl methacrylate (ICM)

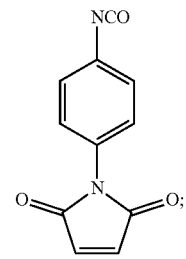

iv) allyl isocyanate (AIC)

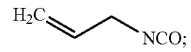

or any combination thereof.

In a certain particular aspect, the isocyanate group containing compound can be 2-isocyanatoethyl acrylate (ICA). In another certain particular aspect, the isocyanate group containing compound may be 3-isopropenyl-α,α-dimethylbenzyl isocyanate (IDI).

The at least one second monomer of the polymerizable material can be different than the at least one first monomer and may polymerize together with the at least one first monomer. Non-limiting examples of the at least one second monomer can be an acrylate monomer, a maleimide monomer, an epoxide monomer, a vinylbenzene (for example, divinylbenzene), or any combination thereof.

In a particular aspect, the at least one second monomer can include at least one acrylate monomer. In one aspect, the at least one acrylate monomer can be a combination of at least one mono-functional acrylate monomer and at least one multi-functional acrylate monomer. As used herein, the term acrylate monomer relates to any monomer structure including an acrylate unit or substituted acrylate unit, for example, a methacrylate unit.

The amount of the mono-functional acrylate monomer can be at least 20 wt % based on the total weight of photocurable composition, or at least 30 wt %, or at least 40 wt %, or at least 50 wt %. In another aspect, the amount of mono-functional acrylate monomer may be not greater than 70 wt %, or not greater than 60 wt %, or not greater than 50 wt %, or not greater than 45 wt %.

In a certain aspect, the multi-functional acrylate monomer can be di-functional acrylate monomer. In other aspects, the multi-functional acrylate monomer can be a tri-functional or a tetra-functional acrylate monomer. The amount of the multi-functional acrylate monomer can be at least 10 wt % base on the total weight of the photocurable composition, or at least 15 wt %, or at least 20 wt %, or at least 30 wt %, or at least 40 wt % based, or at least 50 wt %. In another aspect, the amount of the multi-functional acrylate monomer may be not greater than 70 wt %, or not greater than 60 wt %, or not greater than 50 wt %, or not greater than 40 wt %.

In a particular aspect, the polymerizable material can include at least two mono-functional acrylate monomers and at least one di-functional acrylate monomer.

Non-limiting examples of acrylate monomers can be benzyl acrylate (BA); 1-naphthyl acrylate (1-NA); isobornyl acrylate (IBOA); benzyl methacrylate (BMA); 1-naphthyl methacrylate (1-NMA); tetrahydrofurfuryl acrylate, isobornyl acrylate (IBOA), dicyclopentanyl acrylate, pentafluorobenzyl acrylate, 1-adamantyl methacrylate, 2-adamantyl acrylate, trimethyl cyclohexyl acrylate, or neopentylglycol diacrylate, or bisphenol A dimethacrylate (BPADMA).

In yet a further embodiment, the amount of polymerizable material contained in the photocurable composition can be at least 60 wt % based on the total weight of the photocurable composition, such as at least 70 wt %, at least 80 wt %, at least 85 wt %, at least 90 wt %, or at least 95 wt %. In another aspect, the amount of polymerizable material may be not greater than 99.5 wt %, such as not greater than 99 wt %, or not greater than 98 wt %, or not greater than 97 wt %, or not greater than 95 wt %, or not greater than 93 wt %, or not greater than 90 wt %. Moreover, the amount of polymerizable material can be within a range containing any of the minimum and maximum values noted above. In a particular aspect, the amount of polymerizable material can be at least 85 wt % and not greater than 98 wt % based on the total weight of the photocurable composition.

In a further aspect, the photocurable composition of the present disclosure may be free of a solvent. As used herein, the term "solvent", if not indicated otherwise, relates to a liquid compound in which the polymerizable material can dissolve, but the solvent itself is not polymerizable.

In one embodiment, the selection of the monomers contained in the polymerizable material can be made to obtain a low viscosity of the curable composition before curing. In one aspect, the viscosity of the photocurable composition can be not greater than 30 mPa·s, or not greater than 25 mPa·s, or not greater than 20 mPa·s, or not greater than 15 mPa·s, or not greater than 12 mPa·s, or not greater than 10 mPa·s, or not greater than 8 mPa·s. In another aspect, the viscosity may be at least 2 mPa·s, such as at least 3 mPa·s, or at least 4 mPa·s, or at least 5 mPa s. In a particular aspect, the curable composition can have a viscosity of not greater than 10 mPa s. As used herein, all viscosity values relate to viscosities measured at a temperature of 23° C. with the Brookfield method.

In order to initiate the photo-curing of the composition if exposed to light, one or more photo-initiators can be included in the photocurable composition.

In another certain aspect, the curing can be conducted by a combination of light and heat curing, wherein the additional heat curing can improve the heat stability. In one particular aspect, the heat curing following the curing initiated by light can be at a temperature between 60° C. and 250° C. In a particular aspect, the heat curing can be conducted between 190° C. and 230° C.

In a further aspect, the photocurable composition can contain at least one optional additive. Non-limiting examples of optional additives can be a surfactant, a dispersant, a stabilizer, a co-solvent, an initiator, an inhibitor, a dye, or any combination thereof.

It has been surprisingly discovered that by selecting certain combinations of an isocyanate group containing compound of formula (1) and at least one second monomer, photocurable compositions can be made which may have after curing a strong adhesion to an underlying substrate without the presence of an adhesion layer, and may be usable for AIP or NIL processing. Not being bound to theory, it is assumed that the isocyanate group of the isocyanate group containing compound can react with functional groups contained on the surface of the substrate, for example, hydroxyl groups, amine groups, or carboxyl groups, and thereby form covalent bonds which contribute to a strong adhesion strength of the photo-cured layer to the substrate. Furthermore, the isocyanate group containing compound may participate in polymerization and cross-linking reactions via the carbon-carbon double bond during photo-curing and be covalently integrated in the polymeric matrix formed during photo-curing.

In one embodiment, a photo-cured layer formed from the photocurable composition of the present disclosure can be part of a laminate (10), wherein the laminate (10) can comprise a substrate (11), and the photo-cured layer (12) directly overlying the substrate (11), see FIG. 1.

The material of the substrate of the laminate may not be limited. Non-limiting examples of the substrate can be a ceramic, silicon, a metal, a metal alloy, a polycarbonate, or an organic polymer, such as a polyimide, a polyurethane, PTFE, PVDF, or a polyamide.

In one aspect, the adhesion strength (herein also called pull-off strength) of the photo-cured layer to a silicon substrate at 23° C. according to ASTM D 4541 can be at least 6.5 MPa, such as at least 7.0 MPa, at least 7.5 MPa, at least 8.0 MPa, or at least 8.5 MPa. In another aspect, the adhesion strength may be not greater than 20 MPa, such as not greater than 15 MPa, or not greater than 10 MPa. Not being bound to theory, it is assumed that the outer surface of the silicon substrate contains a thin silicon oxide layer which generates hydroxyl groups upon exposure to the moisture in the air, and the isocyanate groups of the isocyanate group containing compound react with the hydroxyl groups on the substrate surface and form covalent bonds.

In a particular aspect, the photocurable composition of the present disclosure is adapted for being a liquid resist composition for use in IAP and NIL processing to form a photo-cured resist layer.

The present disclosure is further directed to a method of forming a photo-cured layer. The method can comprise applying the photocurable composition described above directly on an outer surface of a substrate; bringing the photocurable composition into contact with a superstrate; irradiating the photocurable composition with light to form the photo-cured layer; and removing the superstrate from the photo-cured layer. As used herein, the term photo-cured layer means that the photocurable composition is converted from a liquid stage to a solid stage, wherein the solid stage means that the photocurable composition is at least partially cured or fully cured.

In one aspect, the light irradiation can be conducted with light having wavelength between 250 nm to 760 nm. In a preferred aspect, the light irradiation may be conducted with light having a wavelength between 320 nm and 450 nm.

The substrate and the solidified (cured) layer may be subjected to additional processing to form a desired article, for example, by including an etching process to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles (devices).

The cured layer may be further used as an interlayer insulating film of a semiconductor device, such as LSI, system LSI, DRAM, SDRAM, RDRAM, or D-RDRAM, or as a resist film used in a semiconductor manufacturing process.

EXAMPLES

The following non-limiting examples illustrate the concepts as described herein.

Example 1

Preparing of photocurable resist compositions.

A photocurable base composition was prepared including the following ingredients: 10 wt % isobornyl acrylate (IBOA), 35 wt % benzyl acrylate (BA), 50 wt % neopentylglycol diacrylate (SR247), 2 wt % photoinitiator Irgacure® TPO 4265 from BASF (diphenyl(2,4,6-trimethylbenzoyl)phosphine oxide), and 3 wt % photoinitiator Irgacure® 4265 from BASF (a 50:50 blend of 2-hydroxy-2-methyl-1-phenyl-1-propanone and diphenyl (2,4,6-trimethylbenzoyl) phosphine oxide). All weight % amounts relate to the total weight of the photocurable base composition. The photocurable base composition is called in the following sample C2.

A variety of photocurable compositions (S1 to S6) were prepared by adding to the base composition an isocyanate group containing compound in amounts between 1 wt % and 10 wt % based on the total weight of the photocurable composition. As isocyanate group containing compounds were used 2-isocyanatoethyl acrylate and 3-isopropenyl-α,α-dimethylbenzyl isocyanate, which both contain in addition to the isocyanate group a carbon-carbon double bond, either as acrylate group or vinyl group.

A summary of all photocurable compositions is shown in Table 1.

TABLE 1

| Sample | Type of NCO-group containing compound | Amount of NCO compound [wt %] | Viscosity [mPa s] | Adhesion Strength [MPa] | Adhesion |
|---|---|---|---|---|---|
| S1 | 2-isocyanatoethyl acrylate ($H_2C=CH-C(=O)-O-CH_2CH_2-NCO$) | 1 | | 8.1 | good |
| S2 | 2-isocyanatoethyl acrylate ($H_2C=CH-C(=O)-O-CH_2CH_2-NCO$) | 5 | | 8.6 | good |
| S3 | 2-isocyanatoethyl acrylate ($H_2C=CH-C(=O)-O-CH_2CH_2-NCO$) | 10 | 4.9 | 8.96 | good |
| S4 | 3-isopropenyl-α,α-dimethylbenzyl isocyanate | 1 | | 7.0 | good |
| S5 | 3-isopropenyl-α,α-dimethylbenzyl isocyanate | 5 | | 7.15 | good |

TABLE 1-continued

| Sample | Type of NCO-group containing compound | Amount of NCO compound [wt %] | Viscosity [mPa s] | Adhesion Strength [MPa] | Adhesion |
|---|---|---|---|---|---|
| S6 | 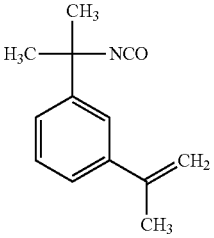 | 10 | 5.7 | 7.37 | good |
| C1 | 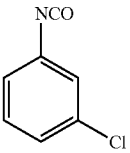 | 1 | | 5.99 | some |
| C2 | — | — | 5.0 | 0.95 | none |
| C3* | — | — | 5.0 | 7.80 | good |

*) containing underlying adhesion layer

A comparative photocurable composition (C1) was prepared by adding to the base composition 3-chlorophenyl isocyanate, a compound which contains an isocyanate group but does not contain a carbon-carbon double bond.

It can be seen that adding the selected isocyanate-group containing compounds to the photocurable base composition did not lead to an increase in viscosity, even if the isocyanate group containing compound was added in an amount of 10 wt %. All samples had a viscosity below 10 mPa·s, and were suitable for NIL or IAP processing.

Preparing of Laminates and Testing of Adhesion Strength

For the measuring the adhesion strength of the photo-cured resist to the silicon wafer, the following assembly was constructed and tested:

A virgin grade silicon wafer (double-sided polished, from Advantive Technologies) having a diameter size of 200 mm was cut in 25 mm×25 mm square pieces. In the center of a 25 mm×25 mm size silicon wafer piece were dropped 2 μl of a liquid resist sample with a pipette, and a glass rod having a diameter of 5 mm and a length of 10 mm was placed at one end within the liquid resist and positioned in its length direction (z) perpendicular to the wafer surface (x-y). The glass rod contained a solid adhesion layer coating made from TranSpin BT20-10, see also US 2007/0212494 which is incorporated by reference herein. The adhesion layer of the glass rod was selected that it insured a stronger adhesion strength of the glass rod to the photo-cured resist than the adhesion strength of the photo-cured resist to the silicon wafer.

The photo-curing of the liquid resist placed on the silicon wafer was conducted at room temperature (23° C.) by exposure to UV light having an intensity of 16 mW/cm² for 18.8 seconds, which corresponds to a curing energy of 300 mJ.

After the photo-curing, an aluminum plate was attached on the back side of the silicon wafer (the uncoated side of the wafer) with an epoxy adhesive (Gorilla Epoxy Adhesive Clear from Gorilla Glue Company, not shown). The aluminum plate had a size of 25 mm×50 mm and a thickness of ⅛ inches and covered the complete silicon wafer. The epoxy adhesive was selected that the adhesion strength of the aluminum plate to the silicon wafer was stronger than the adhesion strength of the photo-cured resist layer to the silicon wafer.

The actual adhesion test (measuring the pull-off strength) was conducted according to ASTM D 4541, using an Instron Model 5542 Tensile Tester. The silicon wafer attached to the aluminum plate and containing the glass rod anchored with one end to the silicon substrate via the photo-cured resist was placed in a fixed position in the Tensile Tester. A moving head from the Instron tensile tester was adjusted that it moved with a speed of 0.5 mm per minute towards the glass rod and hit the glass rod at its side, 1.5 mm away from the end of the glass rod attached to the resist, and the force was recorded at which the glass rod with the attached resist layer was separated from the silicon substrate. The adhesion strength (i.e., pull-off strength of the resist to the silicon wafer) was measured in pounds and normalized to pounds/mm² (dividing by the surface area of 19.62 mm² of the glass rod end), and further converted to the unit MPa by multiplication with the factor 0.2248. In the prepared testing setup, the weakest interface was the interface between the silicon wafer to the cured resist layer, and the force was measured needed to pull the resist layer via the glass rod away from the silicon wafer.

For each sample the testing was repeated eight times and an average value was calculated.

As a further comparative sample (C3), a silicon substrate was used containing an adhesion promoter layer made of acryloxymethyltrimethoxysilane and coated with the photocurable base composition described above, which did not contain a isocyanate group containing compound.

A summary of the results of the adhesion strength tests is also shown in Table 1. It can be seen that the base composition (C2), directly applied on the silicon wafer, without an adhesion layer between silicon substrate and base layer had nearly no adhesion. Adding only 1 wt % of the isocyanate group containing compound 2-isocyanatoethyl acrylate (ICA) (see S1) or 3-isopropenyl-α,α-dimethylbenzyl isocyanate (IDI) (see S4), the adhesion strength was highly increased, such as from 0.95 MPa (C2) to 8.1 MPa (S1), and from 0.95 MPa (C2) to 7.0 MPa (S4). Further increasing the amount of isocyanate group containing compound from 1 wt % of up to 10 wt % caused a further increase of the adhesion strength for compound ICA, from 8.1 MPa (S1) to 8.96 MPa (S3), while only a minor further increase in the pull-off strength could be observed for compound IDI, from 7.0 MPa (S4) to 7.37 MPa (S6).

If an isocyanate group containing compound was added to the base composition, which only contained an isocyanate group, but no carbon-carbon double bond (see C1), a certain pull-off strength increase could be observed in comparison to the photo-cured base composition (C2), but the pull-off strength was much lower than the pull-off strength required to remove the photo-cured layers made with compositions containing an isocyanate group containing compound including a carbon-carbon double bond, and falling under formula (1) described above. The adhesion strength of photo-cured samples S1 to S6 was comparable with the adhesion strength obtained if the base composition was attached to the substrate with a typical adhesion layer (see comparative samples C3).

The adhesion strength test results show that by adding directly to the photocurable resist composition an isocyanate group containing compound falling under formula (1), about the same adhesion strength (measured as pull-off strength) can be obtained as when employing an additional adhesion layer. The data of the experiments demonstrate that the photocurable composition of the present disclosure are suitable to be used in NIL or IAP processing without the additional inclusion of an adhesion layer.

The viscosity of the samples was measured at 23° C., using a Brookfield Viscometer LVDV-II+Pro at 200 rpm, with a spindle size #18. For the viscosity testing, about 6-7 mL of sample liquid was added into the sample chamber, enough to cover the spindle head. For all viscosity testing, at least three measurements were conducted and an average value was calculated.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any sub combination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A photocurable composition comprising a polymerizable material and a photoinitiator, wherein
   the polymerizable material comprises at least one first monomer and at least one second monomer, the at least one first monomer including an isocyanate group containing compound of formula (1): $R_1$-$R_2$—N=C=O (1), with $R_1$ including a carbon-carbon double bond, and $R_2$ being substituted or unsubstituted alkyl, aryl, or alkylaryl;
   an amount of the isocyanate group containing compound is between 1 wt % and 10 wt % based on the total weight of the photocurable composition; and
   a viscosity of the photocurable composition is not greater than 30 mPa s.

2. The photocurable composition of claim 1, wherein $R_1$ of formula (1) is selected from an acrylate group, a methacrylate group or a vinyl group.

3. The photocurable composition of claim 1, wherein $R_2$ is phenyl, or $C_1$-$C_{10}$ alkyl, or $C_1$-$C_6$ alkyl-phenyl.

4. The photocurable composition of claim 1, wherein the isocyanate group containing compound of formula 1 is selected from 2-isocyanatoethyl acrylate, 3-isopropenyl-α,α-dimethylbenzyl isocyanate, 2-isocyanatoethyl methacrylate, allyl isocyanate, or any combination thereof.

5. The photocurable composition of claim 1, wherein the isocyanate group containing compound of formula 1 is selected from 2-isocyanatoethyl acrylate or 3-isopropenyl-α,α-dimethylbenzyl isocyanate.

6. The photocurable composition of claim 1, wherein an amount of the polymerizable material is at least 90 wt % based on a total weight of the photocurable composition.

7. The photocurable composition of claim 1, wherein the at least one second monomer of the polymerizable material includes an acrylate monomer, a maleimide monomer, an epoxide monomer, a vinylbenzene, or any combination thereof.

8. The photocurable composition of claim 1, wherein the at least one second monomer includes at least one monofunctional acrylate monomer and at least one multi-functional acrylate monomer.

9. The photocurable composition of claim 8, wherein an amount of the multi-functional acrylate monomer is at least 20 wt % based on the total weight of the curable composition.

10. The photocurable composition of claim 8, wherein an amount of the multi-functional acrylate monomer is at least 40 wt % based on the total weight of the curable composition.

11. The photocurable composition of claim 1, wherein the viscosity of the curable composition at 23° C. is not greater than 15 mPa·s.

12. The photocurable composition of claim 1, wherein the curable composition is essentially free of a solvent.

13. A laminate comprising a substrate and a photo-cured layer directly overlying the substrate, wherein the photo-cured layer is formed from the photocurable composition of claim 1.

14. The laminate of claim 13, wherein an adhesion strength of the photo-cured layer to a silicon substrate at 23° C. according to ASTM D 4541 is at least 6.5 MPa.

15. A method of forming a photo-cured layer on a substrate, comprising:
   applying a layer of a photocurable composition directly on the substrate, wherein the photocurable composition comprises a polymerizable material and a photoinitiator, the polymerizable material comprising at least one first monomer and at least one second monomer, the at least one first monomer including 1 wt % to 10 wt % of an isocyanate group containing compound of formula (1): $R_1$-$R_2$—N=C=O (1), with $R_1$ including a carbon-carbon double bond, and $R_2$ being substituted or unsubstituted alkyl or aryl, and a viscosity of the photocurable composition is not greater than 30 mPa·s;

bringing the photocurable composition into contact with an imprint template or a superstrate;

irradiating the photocurable composition with light to form a photo-cured layer; and removing the imprint template or superstrate from the photo-cured layer.

16. The method of claim 15, wherein the isocyanate group containing compound of formula (1) is selected from 2-isocyanatoethyl acrylate, 3-isopropenyl-α,α-dimethylbenzyl isocyanate, 2-isocyanatoethyl methacrylate, allyl isocyanate, or any combination thereof.

17. The method of claim 15, wherein the at least one second monomer of the polymerizable material includes at least one mono-functional acrylate monomer and at least one multi-functional acrylate monomer.

18. The method of claim 15, wherein an amount of the polymerizable material is at least 90 wt % based on a total weight of the curable composition.

19. A method of manufacturing an article, comprising:

applying a layer of a photocurable composition on a substrate, wherein the photocurable composition comprises a polymerizable material and a photoinitiator, the polymerizable material comprising at least one first monomer and at least one second monomer, the at least one first monomer including 1 wt % to 10 wt % of an isocyanate group containing compound of formula (1): $R_1$-$R_2$—N=C=O (1), with $R_1$ including a carbon-carbon double bond, and $R_2$ being substituted or unsubstituted alkyl or aryl, and a viscosity of the photocurable composition is not greater than 30 mPa·s;

bringing the photocurable composition into contact with an imprint template or a superstrate;

irradiating the photocurable composition with light to form an at least partially photo-cured layer;

removing the imprint template or the superstrate from the at least partially photo-cured layer;

forming a pattern on the substrate;

processing the substrate on which the pattern has been formed in the forming; and manufacturing an article from the substrate processed in the processing.

* * * * *